(12) United States Patent
Matsuda (10) Patent No.: US 6,399,967 B1
(45) Date of Patent: Jun. 4, 2002

(54) DEVICE FOR SELECTIVELY DETECTING LIGHT BY WAVELENGTHS

(75) Inventor: Kenichi Matsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/611,143

(22) Filed: Jul. 6, 2000

(30) Foreign Application Priority Data

Jul. 6, 1999 (JP) .......................................... 11-192367

(51) Int. Cl.[7] .............................................. H01L 31/101
(52) U.S. Cl. ........................ 257/184; 257/185; 257/186; 257/187; 257/432; 257/436
(58) Field of Search ................... 257/184–187, 257/431–434, 436, 458

(56) References Cited

U.S. PATENT DOCUMENTS 5,668,386 A * 9/1997 Makiuchi et al. ............ 257/184
5,889,296 A * 3/1999 Imamura et al. ............. 257/184

FOREIGN PATENT DOCUMENTS

| JP | 59182581 A | * 10/1984 | .................. 257/187 |
| JP | 1-48663 | 10/1989 | |
| JP | 9-73010 | 3/1997 | |

* cited by examiner

Primary Examiner—Minh Loan Tran
Assistant Examiner—Thomas Dickey
(74) Attorney, Agent, or Firm—Snell & Wilmer, L.L.P.

(57) ABSTRACT

A light receiving device includes a semiconductor substrate, a light absorbing layer provided on the semiconductor substrate, a window layer provided on the light absorbing layer, a wavelength filter provided on the window layer, and a diffusion region provided in the wavelength filter and the window layer. A forbidden bandwidth of the wavelength filter is smaller than a forbidden bandwidth of the window layer, and a forbidden bandwidth of the light absorbing layer is smaller than the forbidden bandwidth of the wavelength filter.

8 Claims, 8 Drawing Sheets

DEVICE FOR SELECTIVELY DETECTING LIGHT BY WAVELENGTHS

BACKGROUND OF THE INVENTION

1. Field of the Invention

The present invention relates to a light receiving device which selectively receives light having a specific wavelength range. More particularly, the present invention relates to a light receiving device which selectively receives a signal light beam having a longer wavelength among a plurality of signal light beams having different wavelengths.

2. Description of the Related Art

Currently, pin photodiodes made of a compound semiconductor are widely used as light receiving devices for the optical fiber communication. The pin photodiodes include a window structure for the purpose of improving the light reception sensitivity. In the pin photodiodes, a light absorbing layer having a narrow forbidden bandwidth (long absorption edge wavelength) is provided near a semiconductor substrate. A window layer having a wide forbidden bandwidth (short absorption edge wavelength) is provided on the light absorbing layer so that light having a wavelength between the absorption edge wavelengths is efficiently absorbed in the light absorbing layer. The absorption edge wavelength of a layer herein means the maximum wavelength of light absorbed by the layer. A most typical pin photodiode made of InGaAs/InP includes a light absorbing layer made of InGaAs and a window layer made of InP. In this case, assuming that this structure receives light from the window layer, the light absorbing layer can receive light in the absorption edge range between 0.9 $\mu$m of InP and 1.65 $\mu$m of InGaAs.

Pass-band pin photodiodes having sensitivity only to light in a narrower wavelength range have been developed. For example, when a wavelength multiplex communication is performed using a signal light beam having a wavelength of 1.3 $\mu$m and a signal light beam having a wavelength of 1.55 $\mu$m, a pass-band photodiode having sensitivity only to each wavelength is used. One of the pass-band photodiodes needs to have a pass-band characteristic in which a sensitivity to a signal light beam having a wavelength of 1.3 $\mu$m is sufficient, but a sensitivity to the signal light beam having a wavelength of 1.55 $\mu$m is substantially zero. Such a characteristic can be achieved if the light absorbing layer is made of InGaAsP having an absorption edge wavelength of 1.4 $\mu$m, instead of InGaAs. With this configuration, the sensitivity to the wavelength 1.3 $\mu$m can be separated 30 dB or more away from the sensitivity to the wavelength 1.55 $\mu$m. This is because an electron-hole pair is not generated in the light absorbing layer by the light beam having a wavelength of 1.55 $\mu$m. Although some absorption of light having a wavelength of 1.55 $\mu$m occurs due to impurity levels in the forbidden band, such absorption has an extremely low efficiency. Therefore, substantially no photoelectric current occurs.

Figure 6:
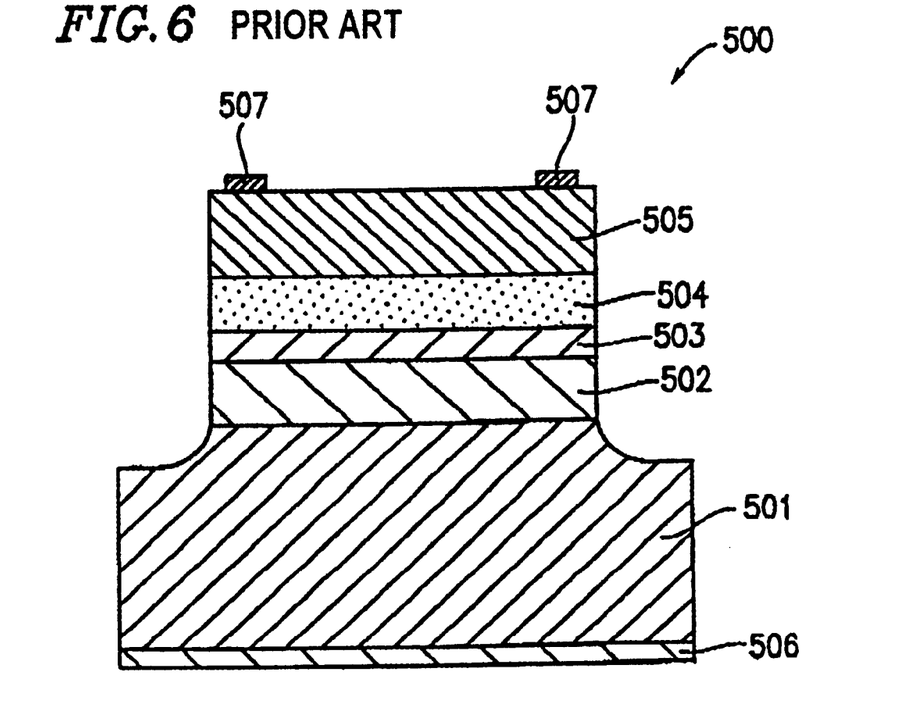
FIG. 6 is a cross-sectional view illustrating a conventional light receiving device.

The other pass-band photodiode needs to have a pass-band characteristic in which there is a sufficient sensitivity to the signal light beam having a wavelength of 1.55 $\mu$m but substantially no sensitivity to the signal light beam having a wavelength of 1.3 $\mu$m. An example of a structure achieving such a characteristic is disclosed in Japanese Publication for Opposition No. 1-48663 (1989). In this publication, a heterojunction phototransistor, but not a pin photodiode, is provided as a light receiving device. Referring to FIG. 6, a heterojunction phototransistor 500 includes a collector layer 502, a base layer 503, an emitter layer 504, and a wavelength filter 505, which are provided on an upper side of a semiconductor substrate 501. A collector electrode 506 is provided on a lower side of the semiconductor substrate 501. An emitter electrode 507 is provided on an upper side of the wavelength filter 505. The collector layer 502, the emitter layer 504, and the wavelength filter 505 are of the same conductivity type as that of the semiconductor substrate 501. The base layer 503 has the opposite conductivity type to that of the layers 502, 504, and 505. The emitter layer 504 has a forbidden bandwidth larger than that of the base layer 503. The forbidden bandwidth of the wavelength filter 505 is intermediate between the forbidden bandwidths of the base layer 503 and the emitter layer 504.

The heterojunction phototransistor 500 has a current amplifying function of a transistor as well as a light receiving function. In terms of the light receiving function, the base layer 503 functions as a light absorbing layer of a pin photodiode, and the emitter layer 504 functions as a window layer thereof. Unless the wavelength filter 505 is provided, the base layer 503 in the heterojunction phototransistor 500 has a high sensitivity to light in the absorption edge range from the absorption edge of the emitter layer 504 to the absorption edge of the base layer 503. Unfortunately, the wavelength filter 505 absorbs light having a wavelength corresponding to the absorption edge of the wavelength filter or less. Therefore, the heterojunction phototransistor 500 has a pass-band characteristic in which only light having a wavelength longer than the absorption edge of the wavelength filter 505. In order to achieve the selective light reception in which the wavelength of 1.3 $\mu$m is rejected and the wavelength of 1.5 $\mu$m is selected, for example, the absorption edge wavelength of the emitter layer 504 is set to 0.9 $\mu$m, the absorption edge wavelength of the base layer 503 is set to 1.65 $\mu$m, and the absorption edge wavelength of the wavelength filter 505 is set to 1.4 $\mu$m. Such settings allow achievement of a long wavelength pass-band characteristic in which a sensitivity to a signal light beam having a wavelength of 1.55 $\mu$m is high, but a sensitivity to the signal light beam having a wavelength of 1.3 $\mu$m is low.

Figure 7:
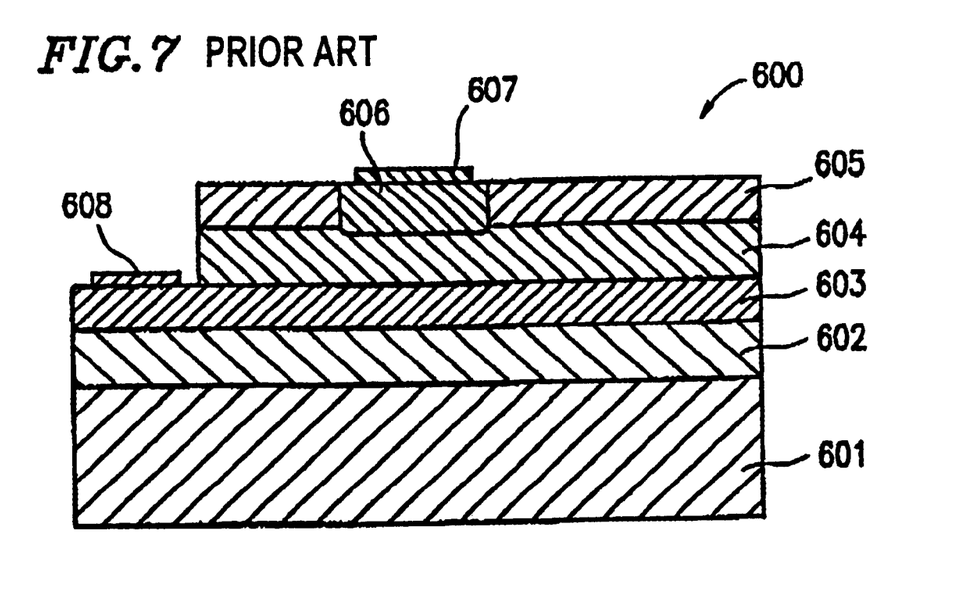
FIG. 7 is a cross-sectional view illustrating another conventional light receiving device.

Japanese Laid-Open Publication No. 9-83010 discloses a pin photodiode which achieves a selective-wavelength capability using the above-described heterojunction phototransistor structure. This example has a complicated structure which includes two pin photodiodes so as to receive light having two wavelengths and further includes other electronic devices. Only the selective-wavelength capability will be described in the following example. Referring to FIG. 7, the heterojunction phototransistor 600 includes a wavelength filter 602, a buffer layer 603, a light absorbing layer 604, and a window layer 605, which are successively provided on a semiconductor substrate 601. An island-like diffusion region 606 in which p-type impurities are diffused is provided in the window layer 605. The light absorbing layer 604 under the diffusion region 606 functions as a light receiving region. A negative electrode 607 is provided on the diffusion region 606. A positive electrode 608 is deposited over a portion of the semiconductor substrate 601 which has been exposed by etching the window layer 605 and the light absorbing layer 604 (on the buffer layer 603). In the example, a signal light beam enters from below the semiconductor substrate 601. The absorption edge wavelengths of the light absorbing layer 604 and the wavelength filter 602 are set to 1.65 $\mu$m and 1.4 $\mu$m, respectively. Such settings allow achievement of a long wavelength pass-band characteristic in which a sensitivity to a signal light beam having a wavelength of 1.55 $\mu$m is high, but a sensitivity to the signal light beam having a wavelength of 1.3 $\mu$m is low.

Among the above-described conventional techniques, the heterojunction phototransistor 500 shown in FIG. 6 receives a signal light beam from the upper side thereof. The phototransistor 500 is in the shape of mesa which is created by etching a region which has been doped during crystal growth. Such a mesa-type light receiving device has a drawback in that a leakage current is likely to occur.

The heterojunction phototransistor 600 shown in FIG. 7 is of a planer type, having a window layer which is caused to be of the p-type layer by the diffusing impurities. Although the transistor 600 has a small leakage current, it receives a signal light beam from the lower side thereof. In the light receiving device which receives light from the lower side thereof, a tail current may occur when part of a signal light beam enters the light absorbing layer other than through the light receiving region. In general, incident light to the light receiving region (the light absorbing layer under the diffusion region) excites an electron-hole pair. The pair is split by an electric field into an electron and a hole, the electron reaching the semiconductor substrate and the hole reaching the diffusion region, thereby immediately generating a photoelectric current. When light enters a portion of the light absorbing layer other than through the light receiving region, an electron-hole pair is also generated. However, such portion of the light absorbing layer has substantially no electric field. Therefore, the hole migrates by diffusion. Thus, the hole migrates for a longer time before reaching the diffusion region. This causes a photoelectric current generated when light enters the portion of the light receiving layer to have a much slower response than that of the photoelectric current generated when light enters the light receiving region. The photoelectric current component having a much slower response is called tail current, which may be a significant problem in some applications of the light receiving device. In the light receiving device which receives light from the lower side thereof, the ring electrode, the conductor, the pad, and the like are provided on the upper side of the device, all the light receiving surface other than the diffusion region are not covered with a light shielding film. In the light receiving device which receives light from the upper side thereof, substantially the entire upper surface of the light receiving device other than the diffusion region can be covered with a light shielding film, thereby making it possible to significantly reduce generation of the tail current.

SUMMARY OF THE INVENTION

According to an aspect of the present invention, a light receiving device includes a semiconductor substrate; a light absorbing layer provided on the semiconductor substrate; a window layer provided on the light absorbing layer; a wavelength filter provided on the window layer; and a diffusion region provided in the wavelength filter and the window layer. A forbidden bandwidth of the wavelength filter is smaller than a forbidden bandwidth of the window layer; and a forbidden bandwidth of the light absorbing layer is smaller than the forbidden bandwidth of the wavelength filter.

According to another aspect of the present invention, a light receiving device includes a semiconductor substrate; and a light receiving region provided on the semiconductor substrate; and a wavelength filter provided in such a way as to cover the light receiving region.

In one embodiment of this invention, the light receiving device further includes a negative electrode provided on the light receiving region; and a pad connected to the negative electrode.

In one embodiment of this invention, the wavelength filter is an absorption filter including a compound semiconductor thin film.

In one embodiment of this invention, the wavelength filter is an interference filter including a dielectric multilayer film.

In one embodiment of this invention, the wavelength filter is provided with a resin.

In one embodiment of this invention, the wavelength filter is provided with a bump.

In one embodiment of this invention, wherein the bump is a solder bump.

In one embodiment of this invention, the light receiving device further includes a light absorbing layer functioning as a light receiving region; and a window layer provided on the light absorbing layer. A forbidden bandwidth of the wavelength filter is smaller than a forbidden bandwidth of the window layer; and a forbidden bandwidth of the light absorbing layer is smaller than the forbidden bandwidth of the wavelength filter.

According to another aspect of the present invention, a method for fabricating a light receiving device, includes the steps of forming a light receiving region on a first semiconductor substrate; forming a wavelength filter on a second semiconductor substrate; attaching the first semiconductor substrate to the second semiconductor substrate in such a way that the processed surfaces of the first semiconductor substrate abut with processed surfaces of the second semiconductor substrate; and exposing the wavelength filter by etching the second semiconductor substrate.

In one embodiment of this invention, the method further includes the step of etching the wavelength filter in such a way to cover the light receiving region.

In one embodiment of this invention, the attaching step includes the step of attaching the first semiconductor substrate to the second semiconductor substrate with a polyimide resin, and the method further includes the step of removing a portion of the polyimide resin not covered with the wavelength filter by dry etching after exposing the wavelength filter.

In one embodiment of this invention, the method further includes the step of forming an attaching pad on one of the first and second semiconductor substrates, and forming a bump on the other of the first and second semiconductor substrates, before the attaching step. The attaching step includes the step of fusion bonding the bump with the attaching pad.

According to another aspect of the present invention, a method for fabricating a light receiving device, includes the steps of forming a light receiving region on a first semiconductor substrate: forming a wavelength filter on a second semiconductor substrate; etching the wavelength filter, leaving a portion of the wavelength filter; attaching the first semiconductor substrate to the second semiconductor substrate in such a way that processed surfaces of the first semiconductor substrate abut with processed surfaces of the second semiconductor substrate; and exposing the wavelength filter by etching the second semiconductor substrate.

In one embodiment of this invention, the attaching step includes the step of attaching the first semiconductor substrate to the second semiconductor substrate with a polyimide resin, and the method further includes the step of removing a portion of the polyimide resin not covered with the wavelength filter by dry etching after exposing the wavelength filter.

In one embodiment of this invention, the method further includes the step of forming an attaching pad on one of the first and second semiconductor substrates, and forming a bump on the other of the first and second semiconductor substrates, before the attaching step. The attaching step includes the step of fusion bonding the bump with the attaching pad.

Thus, the invention described herein makes possible the advantages of (1) providing a planer-type light receiving device which has a long wavelength pass-band characteristic, in which a signal light beam having a longer wavelength is selectively received from among a plurality of signal light beams having different wavelengths, and which receives a signal light from the upper side thereof; and (2) providing the light receiving device further having a sufficiently large sensitivity ratio.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying drawings.

EXAMPLE 1

Figure 1:
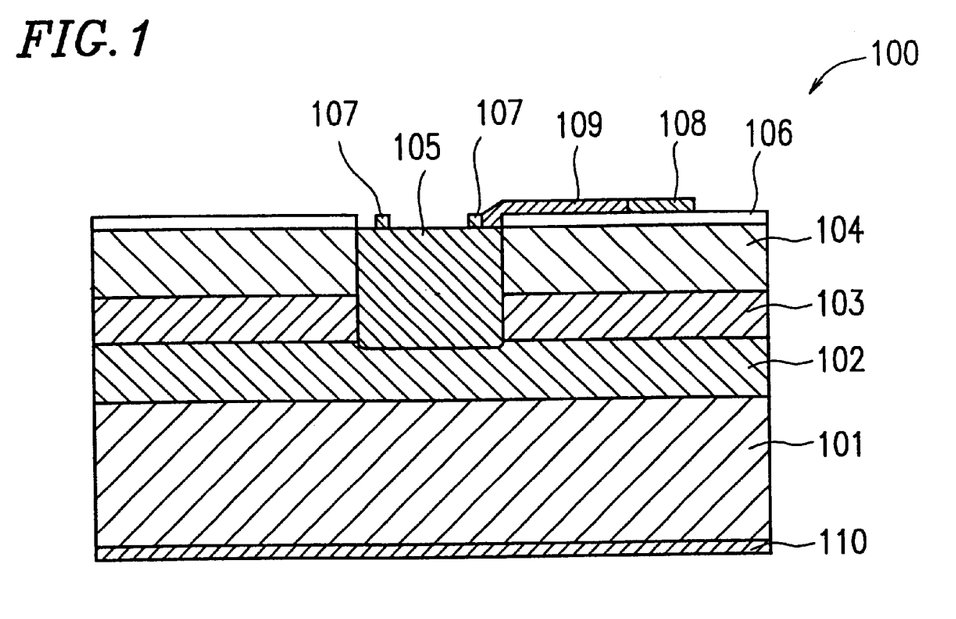
FIG. 1 is a cross-sectional view illustrating a light receiving device according to Example 1 of the present invention.

FIG. 1 is a cross-sectional view illustrating a light receiving device 100 according to Example 1 of the present invention. The light receiving device 100 includes a light absorbing layer 102 made of low-concentration n-type InGaAs; a window layer 103 made of low-concentration n-type InP; and a wavelength filter 104 made of low-concentration n-type InGaAsP, which are successively provided on a semiconductor substrate 101 made of n-type InP. An island-like diffusion region 105 in which p-type impurities such as Zn are diffused is provided in the wavelength filter 104 and the window layer 103, reaching the light absorbing layer 102. The light absorbing layer 102 under the diffusion region 105 functions as a light receiving region. An insulating film 106 is deposited on the wavelength filter 104 but is not deposited on the diffusion region 105. The insulating film 106 is, for example, a lamination film which includes an SiN film having a thickness of about 30 nm and an $SiO_2$ film having a thickness of about 500 nm. The SiN film has a passivation effect in which a leakage current is reduced. The dielectric constant of $SiO_2$ is lower than that of SiN, so that the $SiO_2$ film can reduce the interlayer capacitance.

A negative electrode 107 is provided on the diffusion region 105. The negative electrode 107 is in the shape of a ring when viewed from above. A pad 108 is provided on the insulating film 106. The pad 108 is in the shape of a circle when viewed from above. The negative electrode 107 and the pad 108 are connected to each other via a conductor 109 provided on the insulating film 106. The negative electrode 107, the pad 108, and the conductor 109 may be made of the same thin metal film. In such a case, an example of the thin metal film is a Ti/Pt/Au lamination metal film. A positive electrode 110 made of Au/Sn/Au or the like is deposited on the lower side of the semiconductor substrate 101.

The wavelength filter 104 made of low-concentration n-type InGaAsP has a narrower forbidden bandwidth than that of the window layer 103 made of low-concentration n-type InP. The light absorbing layer 102 made of low-concentration n-type InGaAs has a narrower forbidden bandwidth than that of the wavelength filter 104.

The wavelength filter 104 is, for example, made of InGaAsP having an absorption edge wavelength of about 1.4 $\mu$m and having a thickness of about 3.0 $\mu$m. In this case, a light beam having a wavelength of about 1.55 $\mu$m transmits through the wavelength filter 104 without absorption. On the other hand, about 95% of a light beam having a wavelength of about 1.3 $\mu$m is absorbed by the wavelength filter 104. Accordingly, the light receiving device 100 has a passband characteristic in which only the light beam having a wavelength of about 1.55 $\mu$m is received in a wavelength multiplex communication using the light beam having a wavelength of about 1.3 $\mu$m and the light beam having a wavelength of about 1.55 $\mu$m. With this configuration, the sensitivity to a wavelength of about 1.55 $\mu$m can be separated about 13 dB or more away from the sensitivity to a wavelength of about 1.3 $\mu$m.

EXAMPLE 2

When the light beam having a wavelength of about 1.55 $\mu$m is selectively received as shown in Example 1, it is difficult to improve the sensitivity ratio even if the wavelength filter 104 is provided on the window layer 103. The light beam having a wavelength of about 1.3 $\mu$m is absorbed by the wavelength filter 104 before reaching the light absorbing layer 102. The amount of such absorption is given by 1-exp(-αd) where d denotes the thickness of the wavelength filter and α denotes the absorption coefficient with respect to the light beam having a wavelength of about 1.3 $\mu$m. Accordingly, an absorption rate of 100% is theoretically impossible. An absorption rate of about 99.9% is required for the wavelength filter 104 to obtain a practical sensitivity ratio of about 30 dB. When the absorption coefficient α is 1 $\mu m^{-1}$, the thickness d of the wavelength filter 104 needs to be about 7 $\mu$m.

In the case of a planer-type pin photodiode in which a p-type layer is obtained by diffusing impurities such as Zn into a window layer, the thickness of the window layer is in the range from about 1 $\mu$m to about 2 $\mu$m. Typically, the impurities need to diffuse and reach a depth of such a thickness. On the other hand, in the case of a pin photodiode which receives a signal light beam from the upper side thereof, a wavelength filter having a thickness of about 7 μm needs to be provided on a window layer so as to obtain a sensitivity ratio of about 30 dB. In this case similar to Example 1, impurities need to diffuse and reach a depth of about 8 μm or more. It is difficult to satisfactorily control such diffusion. Further, in the case of a mesa-type pin photodiode in which a window layer and a wavelength filter have previously been doped to become the p-type and thereafter the mesa structure is created by etching, a diffusion processing is not required. However, the depth of the mesa etching needs to be about 8 μm or more. It is thus difficult to obtain a finer electrode pattern. Example 2 provides a solution to such a problem.

Figure 2A:
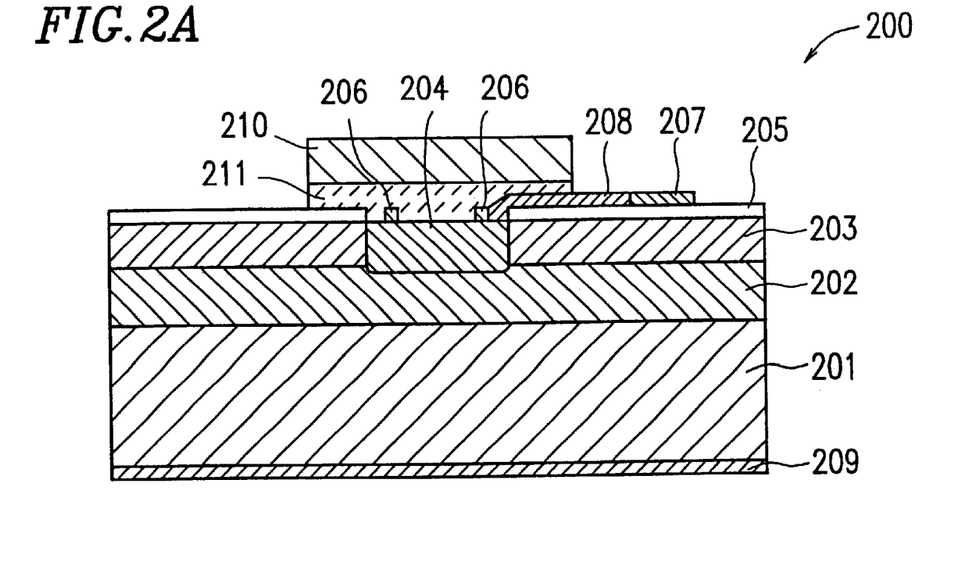
FIG. 2A is a cross-sectional view illustrating a light receiving device according to Example 2 of the present invention.
Figure 2B:
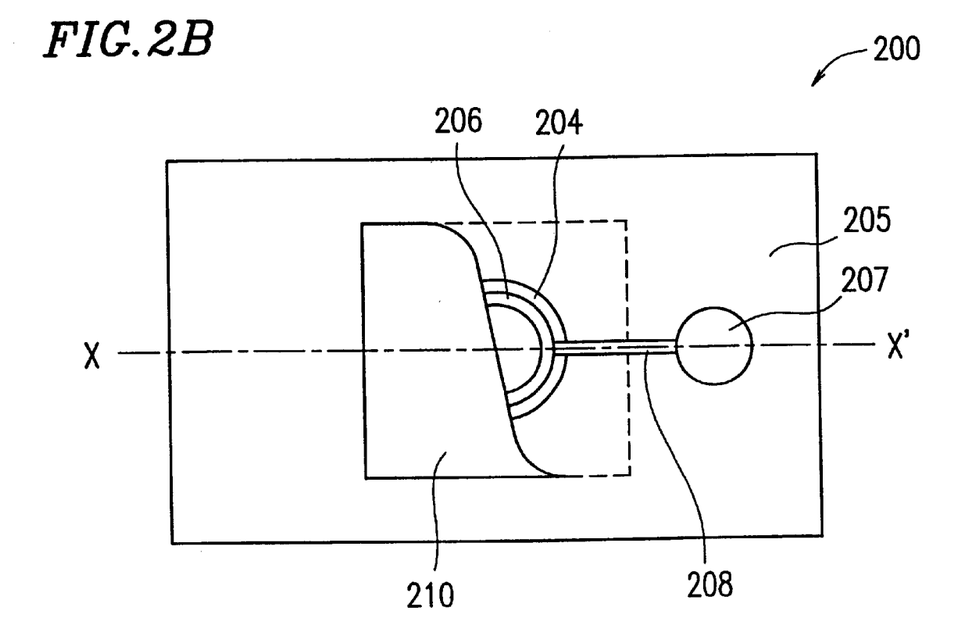
FIG. 2B is a plan view illustrating a light receiving device according to Example 2 of the present invention.

FIG. 2A is a cross-sectional view illustrating a light receiving device 200 according to Example 2 of the present invention. FIG. 2B is a plan view of the light receiving device 200. FIG. 2A is the cross-sectional view taken along chain line X–X' in FIG. 2B. The light receiving device 200 includes a light absorbing layer 202 made of low-concentration n-type InGaAs; and a window layer 203 made of low-concentration n-type InP, which are successively provided on a semiconductor substrate 201 made of n-type InP. An island-like diffusion region 204 including diffused p-type impurities such as Zn is provided in the window layer 203, reaching the light absorbing layer 202. The light absorbing layer 202 under the diffusion region 204 functions as a light receiving region. An insulating film 205 is deposited on the window layer 203 except for the diffusion region 204. The insulating film 205 is, for example, a lamination film which includes an SiN film having a thickness of about 30 nm and an $SiO_2$ film having a thickness of about 500 nm. The SiN film has the passivation effect in which a leakage current is reduced. The dielectric constant of $SiO_2$ is lower than that of SiN, so that the $SiO_2$ film can reduce the interlayer capacitance.

A negative electrode 206 is provided on the diffusion region 204. The negative electrode 206 is in the shape of a ring when viewed from above. A pad 207 is provided on the insulating film 205. The pad 207 is in the shape of an ellipse. The negative electrode 206 and the pad 207 are connected to each other via a conductor 208 provided on the insulating. film 205. The negative electrode 206, the pad 207, and the conductor 208 may be made of the same thin metal film. In such a case, an example of the thin metal film is a Ti/Pt/Au lamination metal film. A positive electrode 209 made of Au/Sn/Au or the like is deposited on the lower side of the semiconductor substrate 201.

A wavelength filter 210 is attached to the processed surfaces of the semiconductor substrate 201 with a resin 211, covering the diffusion region 204. The wavelength filter 210 is a compound semiconductor thin film having a thickness of about 5 μm to about 10 μm. In FIG. 2B, a partial wavelength filter 210 is shown for the purpose of showing the diffusion region 204 and the negative electrode 206. Actually, the wavelength filter 210 completely covers the diffusion region 204 as indicated by a dotted line. The pad 207 is not covered with the wavelength filter 210, so that wire bonding is easily performed for the pad 207.

The wavelength filter 210 is, for example, made of InGaAsP having an absorption edge wavelength of about 1.4 μm and having a thickness of about 7.0 μm. In this case, a light beam having a wavelength of about 1.55 μm transmits through the wavelength filter 210 without absorption. On the other hand, about 99.9% of a light beam having a wavelength of about 1.3 μm is absorbed by the wavelength filter 210. Accordingly, the light receiving device 200 has a pass-band characteristic in which only a light beam having a wavelength of about 1.55 μm is received in a wavelength multiplex communication using the light beam having a wavelength of about 1.3 μm and the light beam having a wavelength of about 1.55 μm. With the above-described configuration, a sensitivity to the wavelength about 1.55 μm can be separated about 30 dB or more away from the sensitivity to the wavelength of about 1.3 μm.

Thus, when the wavelength filter 210 is provided in the light receiving device 200, impurity diffusion is not required for the wavelength filter. Therefore, it is easy to control impurity diffusion in the window layer 203.

Figure 3A:
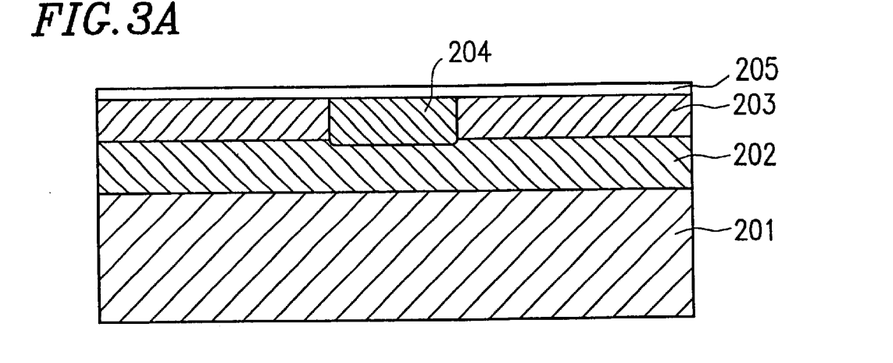
FIGS. 3A through 3F are cross-sectional views for explaining a fabrication method of the light receiving device of Example 2.

Next, a fabrication method of the above-described light receiving device will be described. FIGS. 3A through 3F are cross-sectional views showing steps of a fabrication method of the light receiving device 200 shown in FIGS. 2A and 2B. Referring to FIG. 3A, the light absorbing layer 202 made of low-concentration n-type InGaAs and the window layer 203 made of low-concentration n-type InP are successively crystal grown on the first semiconductor substrate 201 made of n-type InP. Impurities are diffused into a portion of the window layer 203 to form the diffusion region 204. Thereafter, the insulating film 205 is deposited on the window layer 203 and the diffusion region 204. The insulating film 205 is, for example, a lamination film which includes an SiN film having a thickness of about 30 nm and an $SiO_2$ film having a thickness of about 500 nm.

Figure 3B:
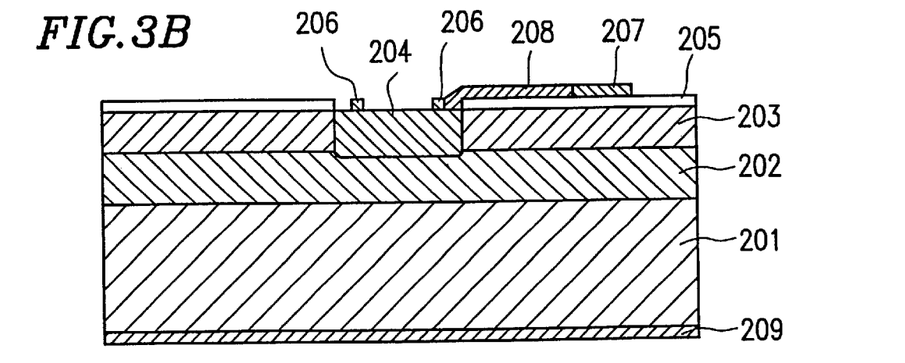
Figure 3C:
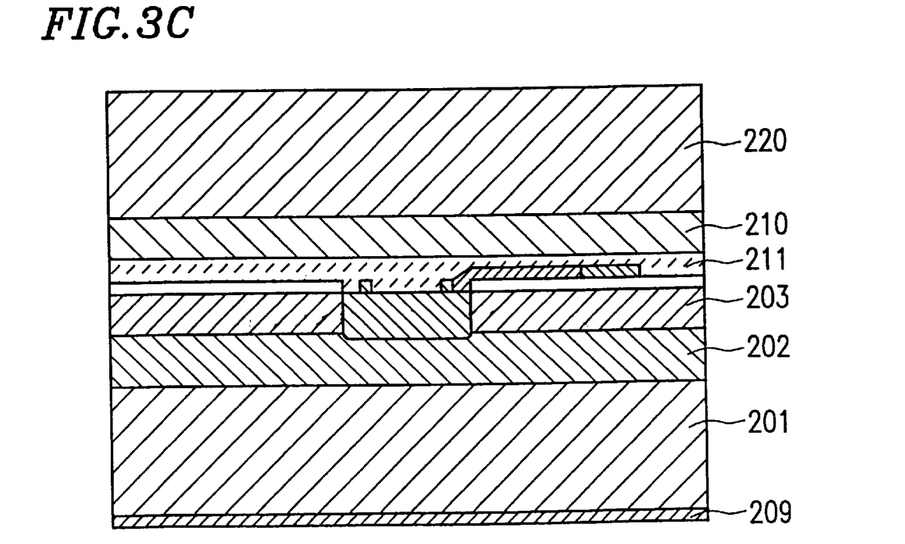

Next, referring to FIG. 3B, an opening is formed. in the insulating film 205 by etching the insulating film 205 so as to expose the diffusion region 204. A thin metal film which is, for example, a Ti/Pt/Au lamination film is deposited and lifted off to form the negative electrode 206 on the diffusion region 204, the pad 207 on the insulating film 205, and the conductor 208 connecting between the negative electrode 206 and the pad 207. The positive electrode 209 made of Au/Sn/Au or the like is deposited on the lower side of the first semiconductor substrate 201.

In a separate process from the above-described process, the wavelength filter 210 is provided on a second semiconductor substrate 220 made of InP. The wavelength filter 210 is made of InGaAsP, having a thickness of about 7 μm and an absorption edge wavelength of about 1.4 μm. Ref erring to FIG. 3C, the first and second semiconductor substrates 201 and 220 are attached to each other with the resin 211 such as polyimide in such a manner that the processed surfaces thereof abut with each other. Specifically, for example, a resin 211 is spin coated on the surface of the first semiconductor substrate 201. The second semiconductor substrate 220 is mounted on the first semiconductor substrate 201 in such a manner that the wavelength filter 210 faces the processed upper side of the first semiconductor substrate 201. The resin 211 is heated and cured while applying a load to the second semiconductor substrate 220.

Figure 3D:
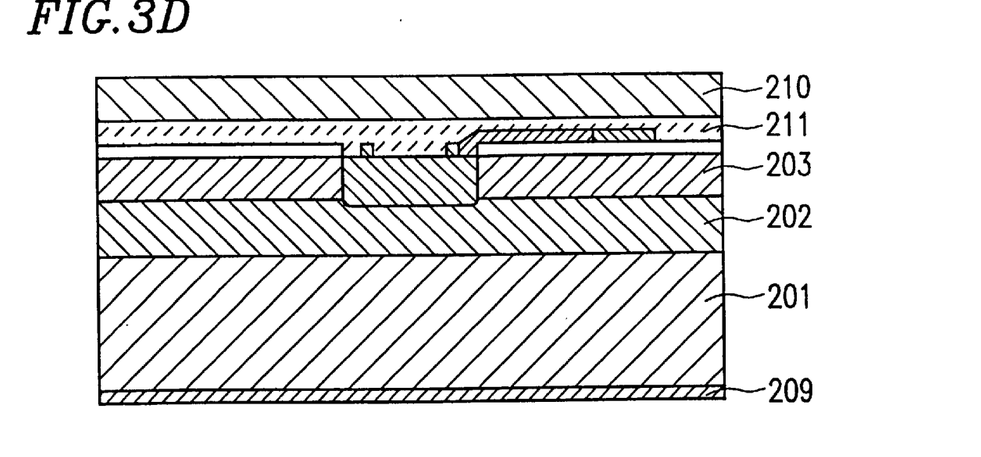

Thereafter, referring to FIG. 3D, the second semiconductor substrate 220 is removed by etching to expose the wavelength filter 210.

Figure 3E:
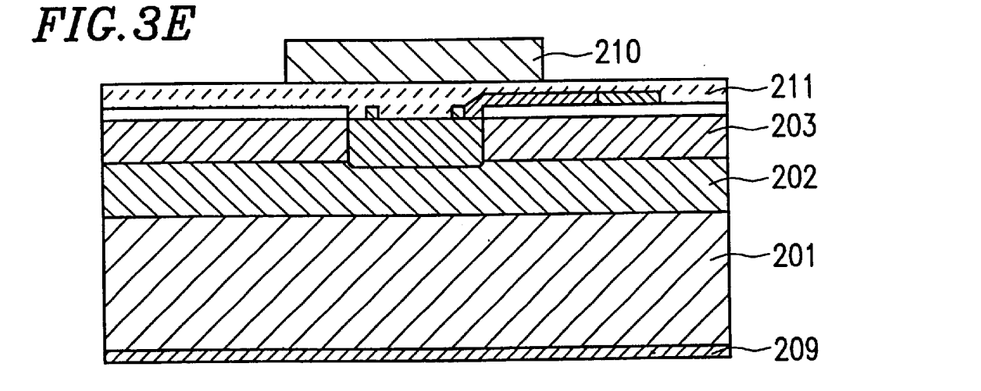

Further, referring to FIG. 3E, the wavelength filter 210 is etched, leaving a portion thereof covering the diffusion region 204. In this process, the wavelength filter 210 is patterned by a typical photolithography technique.

In FIGS. 3A through 3F, only one light receiving device is shown. Actually, the processes shown in FIGS. 3A through 3F are carried out on a wafer on which a number of light receiving devices are provided. Therefore, in the diffusion process shown in FIG. 3A, the island-like diffusion region 204 is formed on the wafer. As to alignment of the photolithography, the second semiconductor substrate 220 is slightly smaller than the first semiconductor substrate 201 so that the wavelength filter 210 does not completely cover the first semiconductor substrate 201. Therefore, the alignment can be performed while observing the pattern on the first semiconductor substrate 201.

Figure 3F:
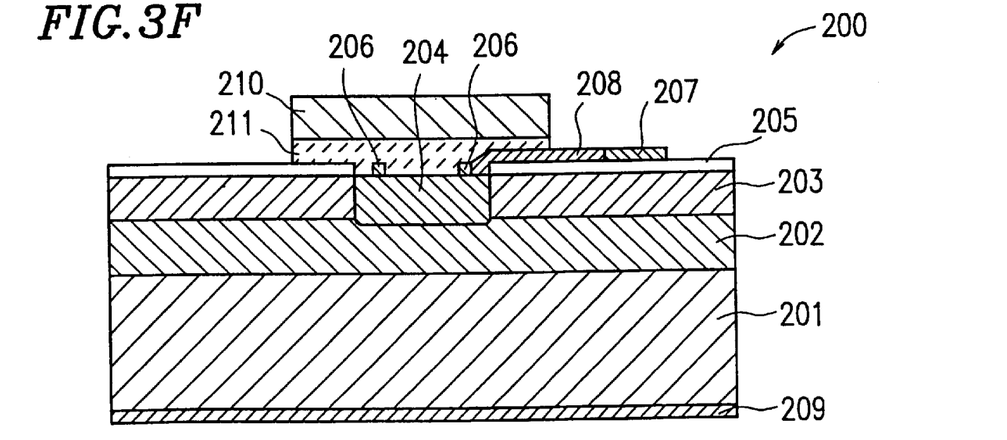

Finally, referring to FIG. 3F, the resin 211 is etched by dry etching using $O_2$ plasma or the like to expose the pad 207 and the insulating film 205.

According to the above-described fabrication method, the processes for attaching the wavelength filter to the semiconductor substrate are performed on a wafer. Specifically, the processes shown in FIGS. 3C through 3F are performed on a wafer on which a number of light receiving devices will be fabricated. This leads to a significant reduction in cost as compared with when the wavelength filters are attached to the light receiving devices on a one-to-one basis. Further, it is unnecessary to handle the individual wavelength filters, thereby making it possible to provide the wavelength filter having a size of about 100 µm or less. The chip size of the light receiving device is not more than the conventional size. The second semiconductor substrate is removed after attachment of the wavelength filter. Therefore, the thickness of the wavelength filter can be set to a sufficient size for light absorption.

Referring to FIG. 3C again, when the wavelength filter 210 is formed on the second semiconductor substrate 220, if the wavelength filter 210 has already been formed in such a way as to have an intended size, it is possible to omit the etching process (FIG. 3E) for the wavelength filter 210.

EXAMPLE 3

Figure 4A:
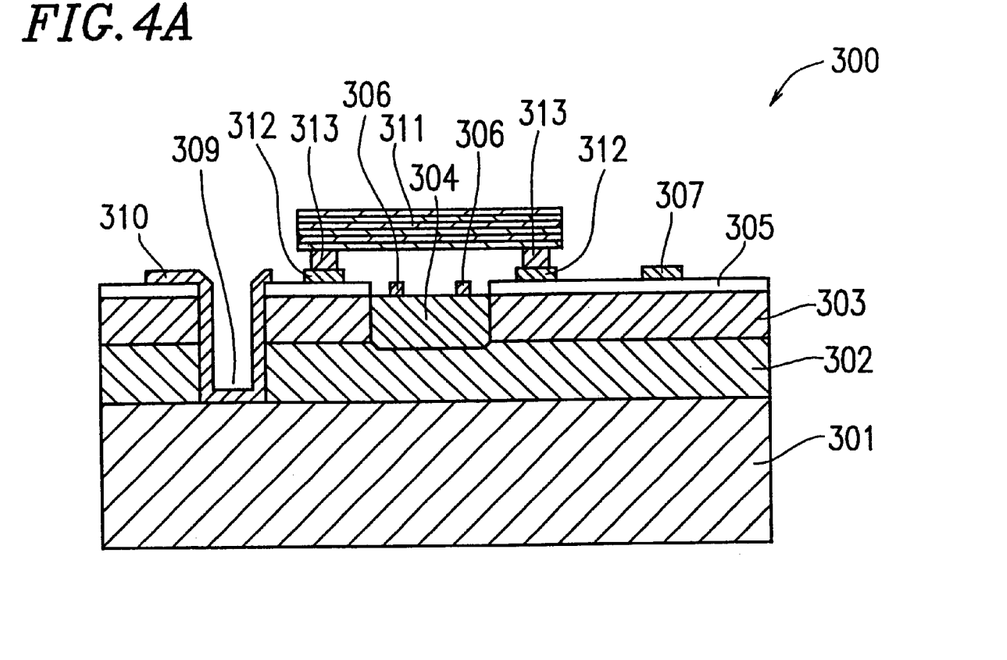
FIG. 4A is a cross-sectional view illustrating a light receiving device according to Example 3 of the present invention.
Figure 4B:
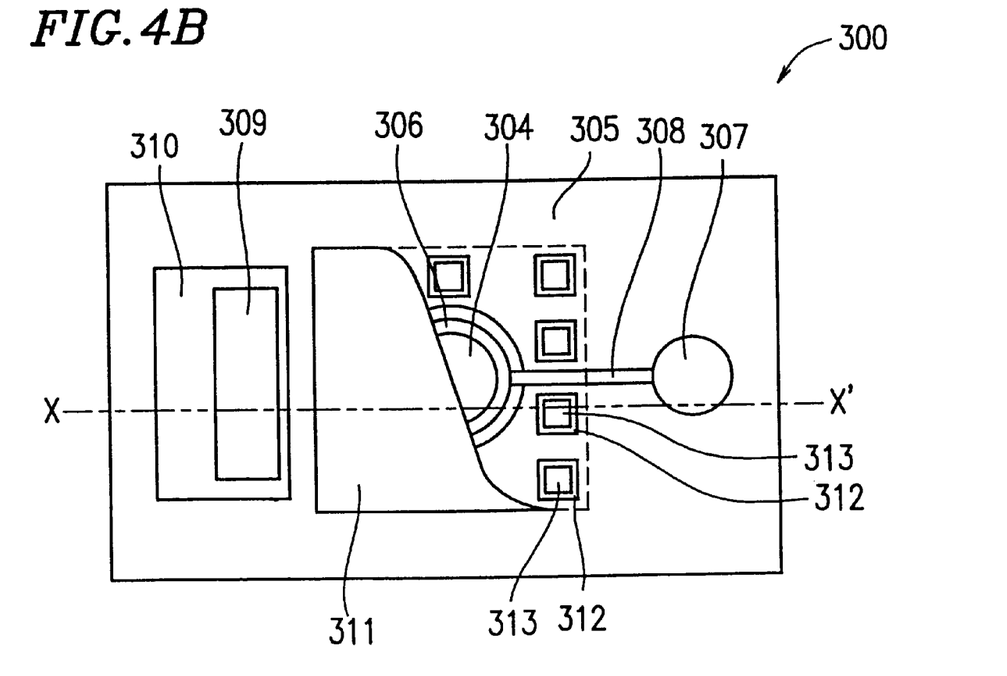
FIG. 4B is a plan view illustrating a light receiving device according to Example 3 of the present invention.

FIG. 4A is a cross-sectional view illustrating a light receiving device 300 according to Example 3 of the present invention. FIG. 4B is a plan view of the light receiving device 300. FIG. 4A is the cross-sectional view taken along chain line X–X' in FIG. 4B. The chain line X–X' is slightly shifted from the center of the device 300. The light receiving device 300 includes a light absorbing layer 302 made of low-concentration n-type InGaAs; and a window layer 303 made of low-concentration n-type InP, which are successively provided on a semiconductor substrate 301 made of n-type InP. An island-like diffusion region 304 into which p-impurities such as Zn are diffused is provided in the window layer 303, reaching the light absorbing layer 302. The light absorbing layer 302 under the diffusion region 304 functions as a light receiving region. An insulating film 305 is deposited on the window layer 303 except for the diffusion region 304. The insulating film 305 is, for example, a lamination film which includes an SiN film having a thickness of about 30 nm and an $SiO_2$ film having a thickness of about 500 nm. The SiN film has the passivation effect in which a leakage current is reduced. The dielectric constant of $SiO_2$ is lower than that of SiN, so that the $SiO_2$ film can reduce the interlayer capacitance.

A negative electrode 306 is provided on the diffusion region 304. The negative electrode 306 is in the shape of a ring when viewed from above. A pad 307 is provided on the insulating film 305. The pad 307 is in the shape of a circle. The negative electrode 306 and the pad 307 are connected to each other via a conductor 308 provided on the insulating film 305 as shown in FIG. 4B. FIG. 4A is a cross-sectional view taken at a position slightly offset from the center of the device 300, so that the conductor 308 is not shown in FIG. 4A. The negative electrode 306, the pad 307, and the conductor 308 may be made of the same thin metal film. In such a case, an example of the thin metal film is a Ti/Pt/Au lamination metal film.

A contact hole 309 is provided on a region other than the diffusion region 304 and the pad 307, penetrating the light absorbing layer 302 and the window layer 303 to reach the semiconductor substrate 301. A positive electrode 310 made of Au/Sn/Au or the like is deposited on the surfaces of the contact hole 309. Alternatively, the positive electrode 310 may be made of the same metal film as the negative electrode 306, the pad 307, and the conductor 308. The reason the positive electrode 310 is also provided on the upper side of the semiconductor substrate 301 is that flip chip bonding can be carried out.

A wavelength filter 311 covering the diffusion region 304 is a dielectric multilayer film in which two types of dielectric material films having different refraction indexes are alternately laminated. The wavelength filter 311 has a high reflectance with respect to a light beam having a wavelength of 1.3 µm and a low reflectance with respect to a light beam having a wavelength of 1.55 µm. There is a known method of designing such a wavelength filter. For example, low and high refraction index films are alternately laminated. The low refraction film has an optical length of one fourth of an incident light having a wavelength of 1.1 µm. The high refraction index film has an optical length of one eighth of an incident light having a wavelength of 1.1 µm. The uppermost and lowermost layers of the lamination film are the high refraction indexes films. The thickness of the wavelength filter depends on the refraction indexes of the low and high refraction index films. For example, when five of the low refraction index films are used, the thickness of the wavelength filter is about 1 to 2 µm. The wavelength filter 311 is attached to the processed surfaces of the semiconductor substrate 301 by fusion bonding the attaching pad 312 on the insulating film 305 with the bump 313 (e.g., made of solder).

In FIG. 4B, the wavelength filter 311 is partially shown for the purpose of showing the diffusion region 304 and the negative electrode 306. Actually, the wavelength filter 311 completely covers the diffusion region 304 as indicated by a dotted line. On the other hand, the pad 307 and the positive electrode 310 are not covered with the wavelength filter 311. The height from the upper surface of the semiconductor substrate 301 to the uppermost surface of the wavelength filter 311 can be about 10 µm or less. Therefore, when using a bump 313 having a height of about 20 µm, flip chip bonding can be performed for the pad 307 and the positive electrode 310.

The wavelength filter 311, for example, has a high reflectance with respect to a light beam having a wavelength of 1.3 µm and a low reflectance with respect to a light beam having a wavelength of 1.55 µm. In this case, a light beam having a wavelength of about 1.55 µm transmits through the wavelength filter 311 without absorption. On the other hand, a light beam having a wavelength of about 1.3 µm is reflected by the wavelength filter 311. Accordingly, the light receiving device 300 has a pass-band characteristic in which only the light beam having a wavelength of about 1.55 µm is received in a wavelength multiplex communication using the light beam having a wavelength of about 1.3 µm and the light beam having a wavelength of about 1.55 µm.

Figure 5A:
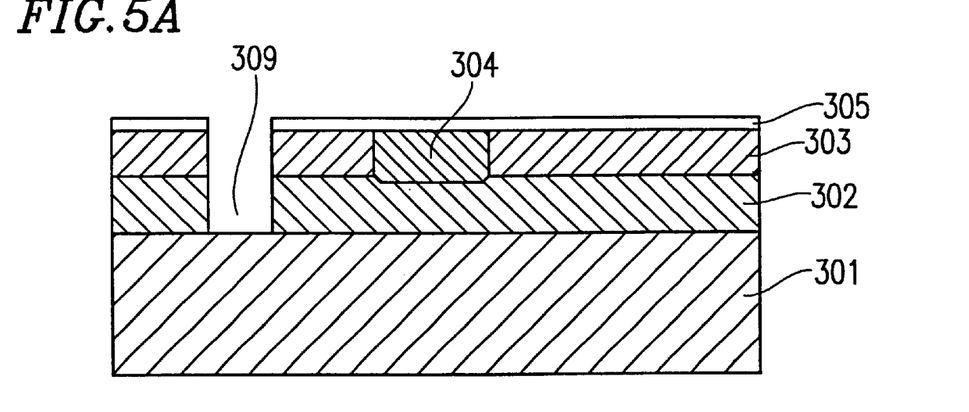
FIGS. 5A through 5E are cross-sectional views for explaining a fabrication method of the light receiving device of Example 3.

Next, a fabrication method of the above-described light receiving device will be described. FIGS. 5A through 5E are cross-sectional views showing steps of a fabrication method of the light receiving device 300 shown in FIGS. 4A and 4B. Referring to FIG. 5A, the light absorbing layer 302 made of low-concentration n-type InGas and the window layer 303 made of low-concentration n-type InP are successively crystal grown on the first semiconductor substrate 301 made of n-type InP. Impurities are diffused into a portion of the window layer 303 to form the island-like diffusion region 304. Thereafter, the insulating film 305 is deposited on the window layer 303 and the diffusion region 304. The insulating film 305 is, for example, a lamination film which includes an SiN film having a thickness of about 30 nm and an $SiO_2$ film having a thickness of about 500 nm. A portion of the window layer 303 and a portion of a light absorbing layer 302 other than the diffusion region 304 are etched to form the contact hole 309.

Figure 5B:
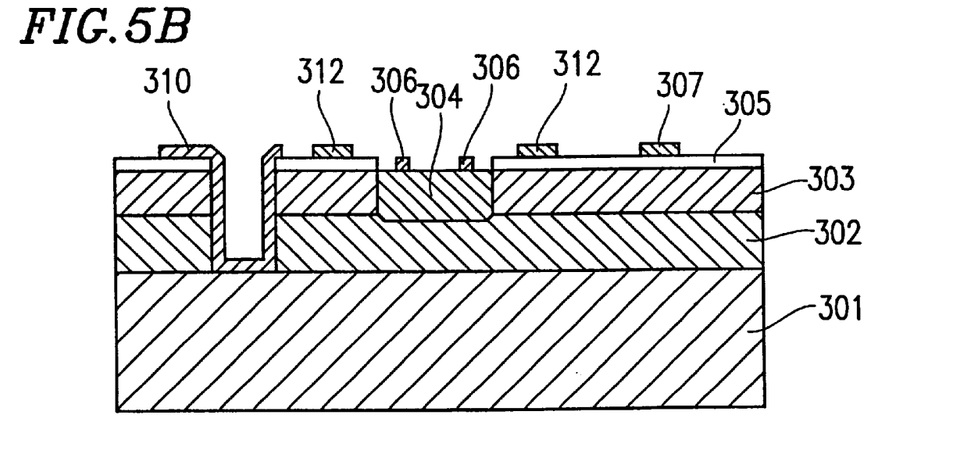

Next, referring to FIG. 5B, an opening is formed in the insulating film by etching the insulating film 305 to expose the diffusion region 304. A thin metal film, which is, for example, a Ti/Pt/Au lamination film, is deposited and lifted off to form the negative electrode 306 on the diffusion region 304, the pad 307 on the insulating film 305, and the conductor 308 connecting between the negative electrode 306 and the pad 307.

Similar to FIG. 4A, FIGS. 5A, 5B, 5D, and 5E are cross-sectional views taken at a position slightly offset from the center of the device 300, so that the conductor 308 is not shown in these figures. The attaching pad 312 and the positive electrode 310 are formed on the insulating film 305 and the contact hole 309, respectively, in the same process which forms the negative electrode 306, the pad 307, and the 308.

Figure 5C:
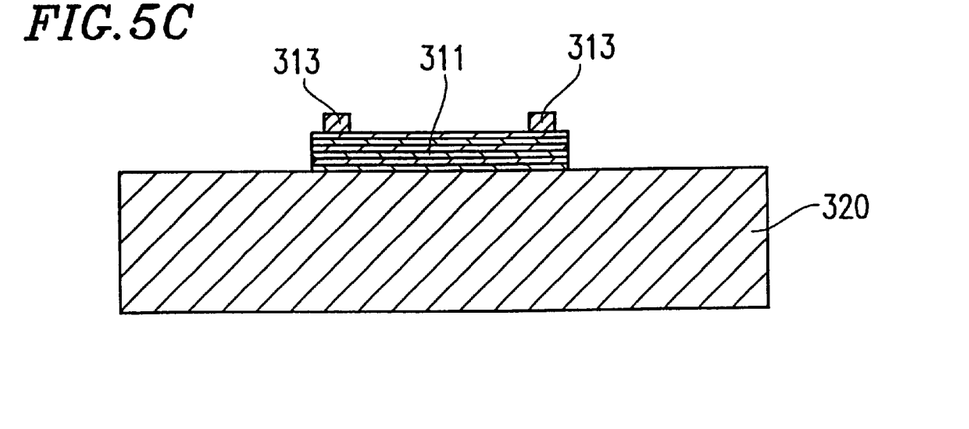

On the other hand, in a separate process from the above-described process, as shown in FIG. 5C, the wavelength filter 311 of the dielectric multilayer film is formed on a second semiconductor substrate 320. The wavelength filter 311 is patterned to have a sufficient size that the wavelength filter 311 covers the diffusion region 304. The solder bump 313 is formed on the wavelength filter 311.

Figure 5D:
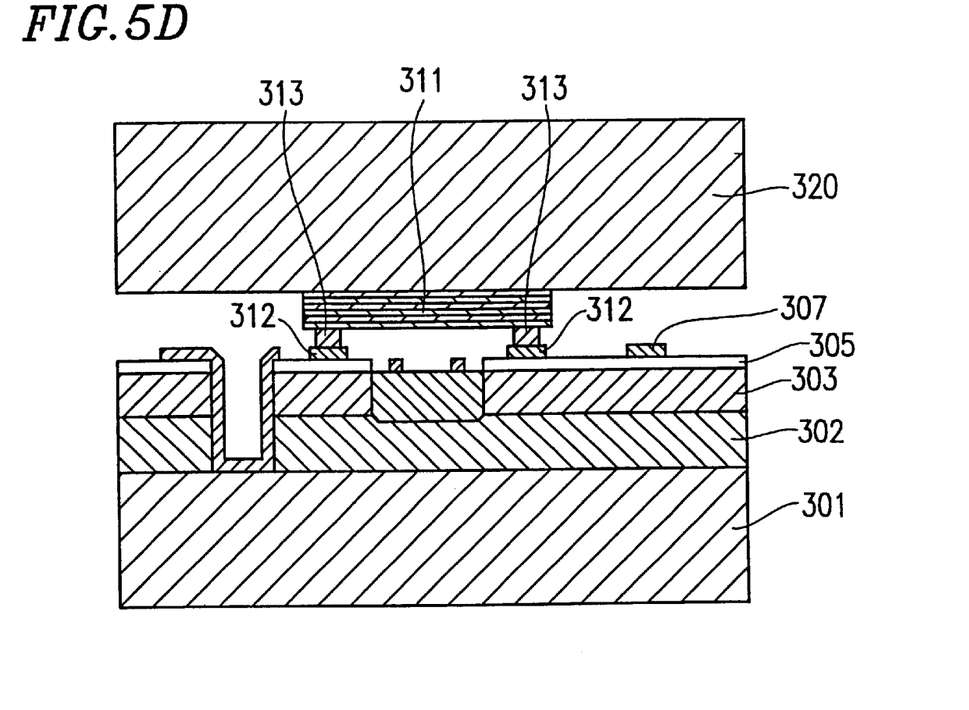

Referring to FIG. 5D, the first and second semiconductor substrates 301 and 320 are attached to each other in such a manner that the processed surfaces thereof abut with each other. Specifically, for example, the first and second semiconductor substrates 301 and 320 are precisely registered with each other, followed by fusion bonding the solder bump 313 with the attaching pad 312. Such a technique has been established as a flip chip bonding technique.

Figure 5E:
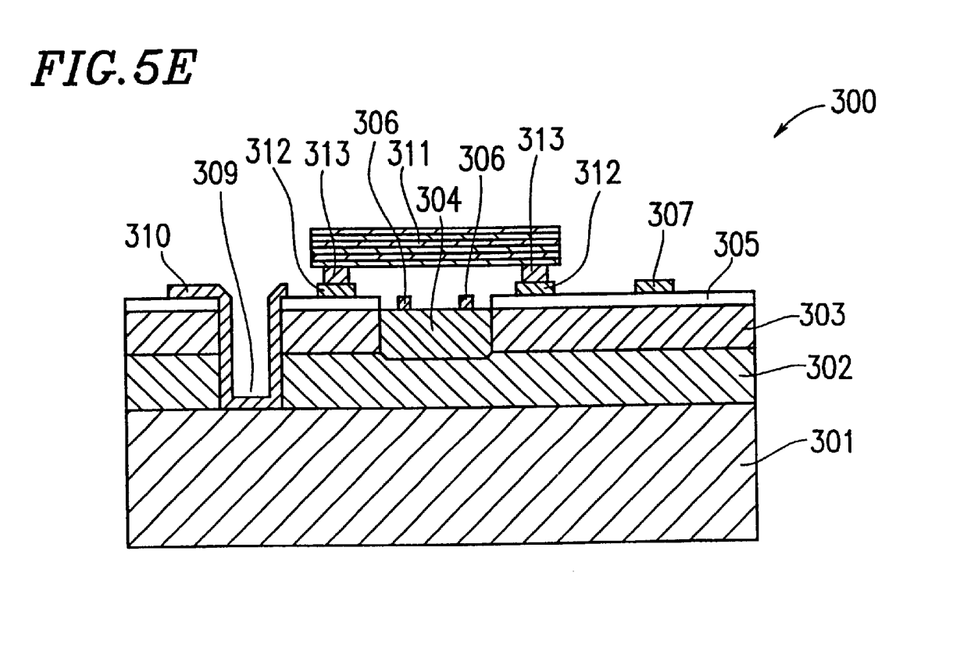

Thereafter, referring to FIG. 5E, the second semiconductor substrate 320 is removed by etching to leave the wavelength filter 311 only over the island-like diffusion region 304. In FIGS. 5A through 5E, only one light receiving device is shown. Actually, the processes shown in FIGS. 5A through 5E are carried out on a wafer on which a number of light receiving devices are provided.

According to the above-described fabrication method, the processes for attaching the wavelength filter to the semiconductor substrate are performed on a wafer. Specifically, the processes shown in FIGS. 5D and 5E are performed on a wafer on which a number of light receiving devices will be fabricated. This leads to a significant reduction in cost as compared with when the wavelength filters are attached to the light receiving devices on a one-to-one basis. Further, it is unnecessary to handle the individual wavelength filters, thereby making it possible to provide the wavelength filter having a size of about 100 μm or less. The chip size of the light receiving device is not more than a conventional size. The second semiconductor substrate is removed after attachment of the wavelength filter. Therefore, the thickness of the wavelength filter can be set to a sufficient size for wavelength selection capability.

In Example 2, (1) the wavelength filter is an absorption filter made of a compound semiconductor; (2) the wavelength filter is attached with a resin to the first semiconductor substrate; and (3) patterning is performed after attachment of the wavelength filter. In Example 3, (1) the wavelength filter is an interference filter made of a dielectric multilayer film: (2) the wavelength filter is attached with a solder to the first semiconductor substrate; and (3) patterning is performed before attachment of the wavelength filter. These features (1), (2), and (3) can be arbitrarily combined between Examples 2 and 3. In the above-described Examples, the semiconductor materials are restricted to InGaAs/InP. AlGaAs/GaAs, SiGe/Si, or the like may be used.

According to the present invention, a light receiving device which selectively receives a light beam in a specific wavelength range, more particularly, a light receiving device which selectively receives a signal light beam having a longer wavelength among a plurality of signal light beams having different wavelengths, can be achieved.

Further, a wavelength filter is not crystal grown on a window layer, but is attached on a semiconductor substrate on which a light receiving device will be provided. Therefore, even when a sufficient sensitivity ratio is desired by means of an absorbing wavelength filter, a fabrication process is easy. The wavelength filter is a thin film and attached in such a way as to cover only a light receiving region. Wire bonding or flip chip bonding can be performed as in typical pin photodiodes.

In the fabrication method, processes for attaching the wavelength filter to the semiconductor substrate are performed on a wafer. This leads to a significant reduction in cost as compared with when the wavelength filters are attached to the light receiving devices on a one-to-one basis. Further, it is unnecessary to handle the individual wavelength filters, thereby making it possible to provide the wavelength filter having a size of about 100 μm or less. The chip size of the light receiving device is not more than a conventional size. The semiconductor substrate is removed after attachment of the wavelength filter. Therefore, the thickness of the wavelength filter can be set to a sufficient size for wavelength selection capability.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light receiving device comprising:

a semiconductor substrate;

a light receiving region provided on the semiconductor substrate;

a window layer provided on the light receiving region;

an island-like diffusion region formed in at least a portion of the window layer by diffusing impurities into the window layer, the light receiving region being provided under the island-like diffusion region; and a wavelength filter attached to the processed surfaces of the semiconductor substrate in such a way as to cover the island-like diffusion region.

2. A light receiving device according to claim 1 further comprising:

a negative electrode provided on the island-like diffusion region; and a pad connected to the negative electrode, the pad not being covered with the wavelength filter.

3. A light receiving device according to claim 1, wherein the wavelength filter is an absorption filter comprising a compound semiconductor thin film.

4. A light receiving device according to claim 1, wherein the wavelength filter is an interference filter comprising a dielectric multilayer film.

5. A light receiving device according to claim 1, wherein the wavelength filter is provided with a resin.

6. A light receiving device according to claim 1, further comprising:

a light absorbing layer functioning as the light receiving region under the island-like diffusion region, wherein a forbidden bandwidth of the wavelength filter is smaller than a forbidden bandwidth of the window layer; and a forbidden bandwidth of the light absorbing layer is smaller than the forbidden bandwidth of the wavelength filter.

7. A light receiving device according to claim 1, wherein the wavelength filter is provided with a bump.

8. A light receiving device according to claim 7, wherein the bump is a solder bump.

* * * * *